(12) United States Patent
Wu et al.

(10) Patent No.: US 10,032,944 B2
(45) Date of Patent: Jul. 24, 2018

(54) TRANSPARENT COVER FOR SOLAR CELLS AND MODULES

(71) Applicant: TSMC SOLAR LTD., Taichung (TW)

(72) Inventors: Jyh-Lih Wu, Tainan (TW); Wen-Tsai Yen, Caotun Township (TW); Wei-Lun Xu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 129 days.

(21) Appl. No.: 14/062,921

(22) Filed: Oct. 25, 2013

(65) Prior Publication Data
US 2015/0114445 A1   Apr. 30, 2015

(51) Int. Cl.
*H01L 31/0216* (2014.01)
*H01L 31/0232* (2014.01)
*H01L 31/048* (2014.01)
*H01L 31/055* (2014.01)
*G02B 5/00* (2006.01)
*H01L 31/18* (2006.01)

(52) U.S. Cl.
CPC .......... *H01L 31/048* (2013.01); *G02B 5/008* (2013.01); *H01L 31/0232* (2013.01); *H01L 31/02168* (2013.01); *H01L 31/055* (2013.01); *H01L 31/18* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 5,807,440 | A * | 9/1998 | Kubota et al. | 136/256 |
| 6,372,538 | B1 * | 4/2002 | Wendt | H01L 31/0322 257/E31.007 |
| 8,414,961 | B1 | 4/2013 | Robinson et al. | |
| 2005/0088078 | A1 * | 4/2005 | Tseng | B82Y 20/00 313/504 |
| 2006/0209300 | A1 * | 9/2006 | Kamins | G01N 21/658 356/301 |

(Continued)

FOREIGN PATENT DOCUMENTS

| | | | |
|---|---|---|---|
| DE | 102008035986 A1 | 2/2010 | |
| EP | 2006917 A2 * | 12/2008 | ........... H01L 31/048 |

(Continued)

OTHER PUBLICATIONS

Definition of metallic [retrieved online at http://www.thefreedictionary.com/metallic on Jul. 31, 2015].*

(Continued)

*Primary Examiner* — Eric R Smith
(74) *Attorney, Agent, or Firm* — Duane Morris LLP

(57) ABSTRACT

A solar cell device and a method of fabricating the same are described. The method of fabricating a solar cell includes forming a photovoltaic substructure including a substrate, back contact, absorber and buffer, forming a transparent cover separate from the photovoltaic substructure including a transparent layer and a plasmonic nanostructured layer in contact with the transparent layer, and adhering the transparent cover on top of the photovoltaic substructure. The plasmonic nanostructured layer can include metal nanoparticles.

16 Claims, 11 Drawing Sheets

(56) References Cited

U.S. PATENT DOCUMENTS

| | | |
|---|---|---|
| 2007/0289623 A1 | 12/2007 | Atwater |
| 2008/0006323 A1* | 1/2008 | Kalkanoglu et al. ......... 136/253 |
| 2008/0110494 A1 | 5/2008 | Reddy |
| 2009/0215224 A1* | 8/2009 | Li ........................... C23C 14/14 |
| | | 438/102 |
| 2009/0320896 A1* | 12/2009 | Gerhardinger .......... B32B 15/18 |
| | | 136/244 |
| 2010/0024874 A1* | 2/2010 | Varaprasad ............. B32B 17/10 |
| | | 136/256 |
| 2010/0126567 A1 | 5/2010 | Kaufman |
| 2010/0137131 A1* | 6/2010 | Awazu ................... B01J 21/063 |
| | | 502/240 |
| 2010/0259826 A1* | 10/2010 | Ji ........................... B82Y 20/00 |
| | | 359/599 |
| 2012/0031486 A1* | 2/2012 | Parce et al. .................... 136/256 |
| 2012/0138937 A1* | 6/2012 | Jo et al. .......................... 257/59 |
| 2012/0152327 A1* | 6/2012 | Pinarbasi et al. ............. 136/251 |
| 2012/0266942 A1* | 10/2012 | Komatsu et al. ............. 136/247 |
| 2013/0037104 A1 | 2/2013 | Larsson |
| 2013/0112258 A1 | 5/2013 | Park et al. |

FOREIGN PATENT DOCUMENTS

| | | |
|---|---|---|
| EP | 2437315 A2 | 4/2012 |
| WO | 2008110567 A1 | 9/2008 |
| WO | WO 2013116569 A1 * | 8/2013 |

OTHER PUBLICATIONS

E. Klampaftis, et al., "Increase in short-wavelength response of encapsulated CIGS devices by doping the encapsulation layer with luminescent material", Solar Energy Materials and Solar Cells 101, p. 62-67 (2012).*

European Search Report dated Feb. 27, 2015 in counterpart EP Patent Application No. 14155861.9.

Hutter, E. et al., "Exploitation of Localized Surface Plasmon Resonance", Advanced Materials, Oct. 2004, 16(19):1685-1706.

Chan, G.H. et al., "Plasmonic Properties of Copper Nanoparticles Fabricated by Nanosphere Lithography", Nano Letters, 2007, 7(7):1947-1952).

* cited by examiner

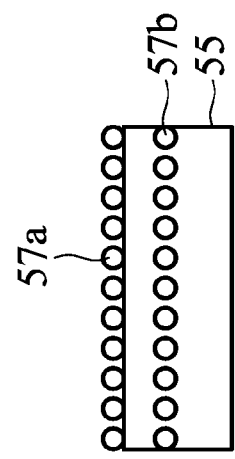
FIG. 4
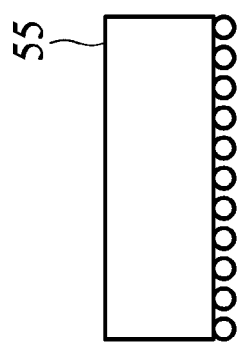
FIG. 5
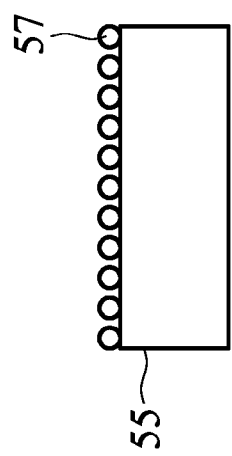
FIG. 6
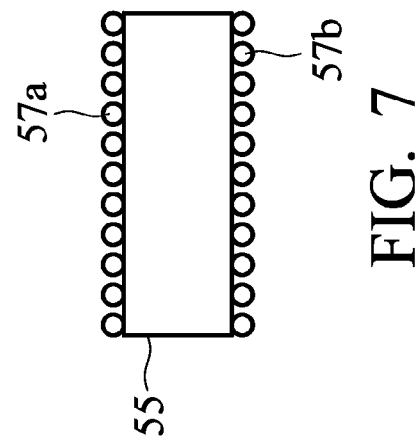
FIG. 7
FIG. 8

TRANSPARENT COVER FOR SOLAR CELLS AND MODULES

TECHNICAL FIELD

The disclosure relates to photovoltaic solar cells and solar modules. More particularly, the disclosure relates to transparent covers for solar modules and methods of fabricating the same.

BACKGROUND

Solar cells are electrical devices for direct generation of electrical current from sunlight. A plurality of solar cells can be connected by respective interconnect structures to form a solar cell module. A plurality of modules can be connected to form an array.

Some solar cell devices include a protective cover over the solar cells. Light passes through the protective cover to the solar cells below for conversion into electrical current via the photovoltaic effect. Optical transmittance through the protective cover affects the efficiency of a solar cell device. For example, the amount of power produced by a solar cell depends on the amount of light that passes through the protective cover and reaches the absorber layer of the solar cell. Additionally, the traveling length of the transmitted light determines the distance it will travel through the absorber layer.

Optical loss through the cover due to reflection, refraction and absorption reduces the amount of light that reaches the solar cell and, in particular, the absorber layer. For example, reflectance at the air/glass interface for a glass protective cover is around 4-5% for normal incidence. Optical loss through the protective cover consequently reduces the efficiency of the solar device.

BRIEF DESCRIPTION OF THE DRAWING

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawing.

FIG. 4 is a schematic cross section view of a transparent cover described herein.

FIG. 5 is a schematic cross section view of a transparent cover described herein.

FIG. 6 is a schematic cross section view of a transparent cover described herein.

FIG. 7 is a schematic cross section view of a transparent cover described herein.

FIG. 8 is a schematic cross section view of a transparent cover described herein.

DETAILED DESCRIPTION

Figure 1:
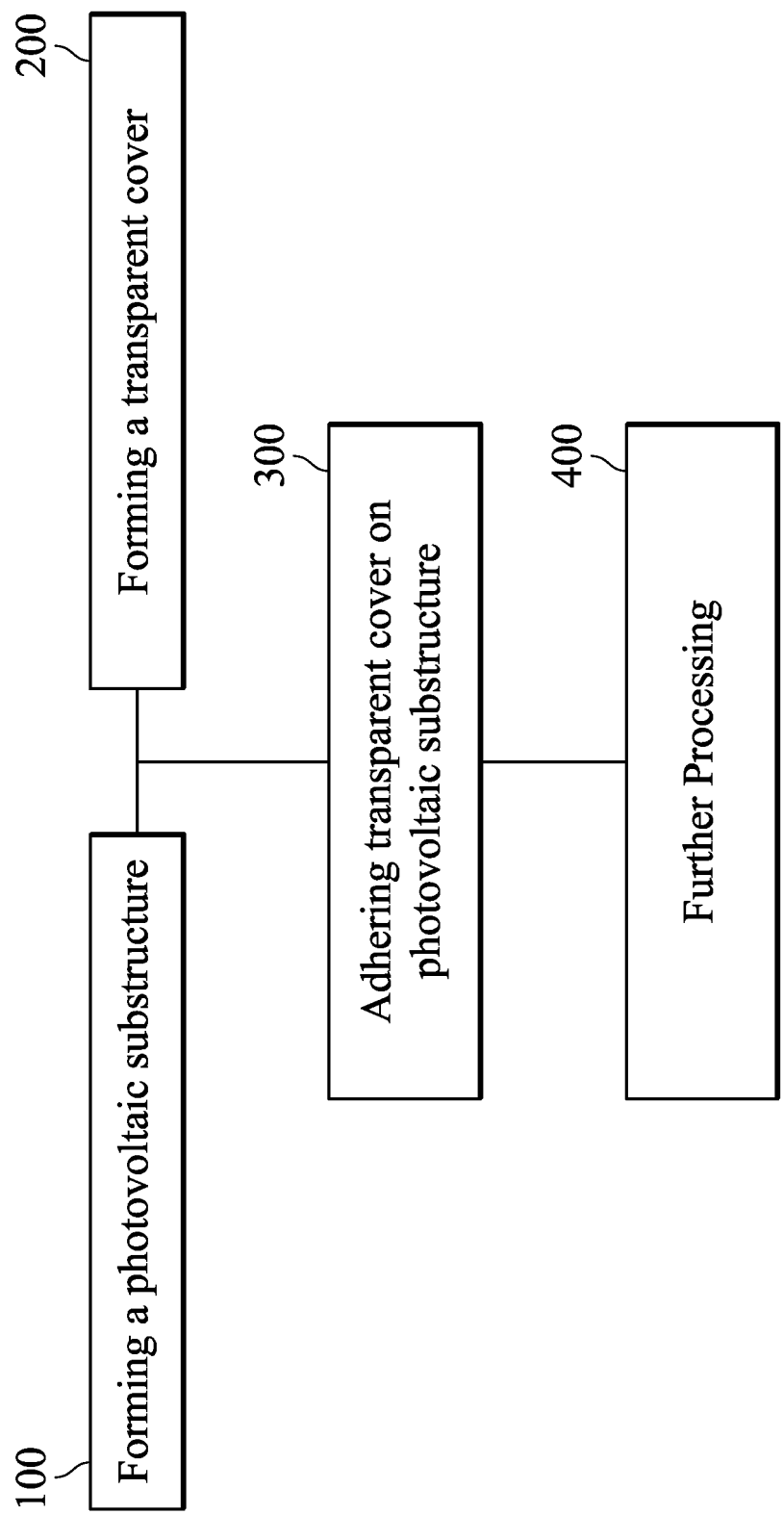
FIG. 1 is a flow chart of a method of fabricating a solar cell device described herein.

In the description, relative terms such as "lower," "upper," "horizontal," "vertical," "over" "above," "below," "up," "down," "top" and "bottom" as well as derivatives thereof (e.g., "downwardly," "upwardly," etc.) should be construed to refer to the orientation as then described or as shown in the drawing under discussion. These relative terms are for convenience of description and do not require that the device be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The disclosure provides for improved photovoltaic solar cell devices and methods for fabricating the devices and substructures. In particular, the disclosure provides for improving module efficiency of solar cells employing enhanced light-harvesting transparent covers. As used herein, the term "transparent" with respect to substructures or materials refers to having the property of transmitting light through the substructure or material and includes transmitting all, substantially all, or a portion of incident light that strikes a surface of the substructure or material.

The transparent cover disclosed herein has enhanced optical properties, exploiting localized surface plasmon resonance (LSPR) to induce forward light scattering and increase the travelling length of incident light through the transparent cover. The enhanced optical properties increases the amount of light passing through the transparent cover to the absorber layers of the solar cell, increases the traveling length of light through the absorber layers, and improves the overall efficiency of the device. Moreover, the transparent cover disclosed herein is incorporated with the solar cell or solar module without damaging the solar cell substructures.

A broad overview of the method used to fabricate solar cells and solar module devices according to the disclosure is provided in FIG. 1. Further details of the method and structures formed according to the methods are described herein and provided in conjunction with the accompanying figures. As shown in FIG. 1, a photovoltaic substructure is formed at step 100 and a transparent cover is formed separately at step 200.

Figure 2A:
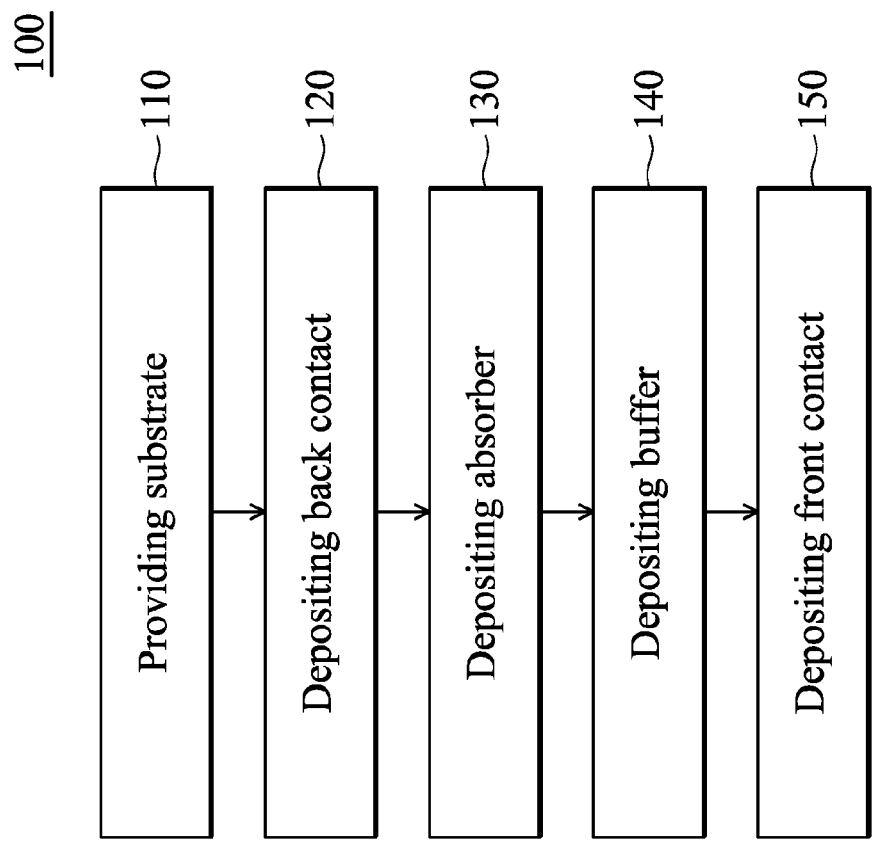
FIG. 2A is a flow chart of a method for step 100 of FIG. 1 described herein.

In some embodiments, the photovoltaic substructure is formed by depositing a back contract, absorber and buffer over a substrate. As shown in FIG. 2A, the substrate can be provided at substep 110. At substep 120, the back contact can be deposited. At substep 130, the absorber can be deposited. At substep 140, the buffer can be deposited. In some embodiments, the photovoltaic substructure can also include a front contact, such as a transparent conductive oxide (TCO) deposited at substep 150. In some embodiments, the photovoltaic substructure can undergo additional processing operations to complete the device and connecting a solar cell to other solar cells to form solar modules. For example, further processing may include forming a top contact over the buffer, scribing interconnect lines and connecting solar cells. In some embodiments, a plurality of solar cells can be connected to form one or more solar modules.

Figure 3A:
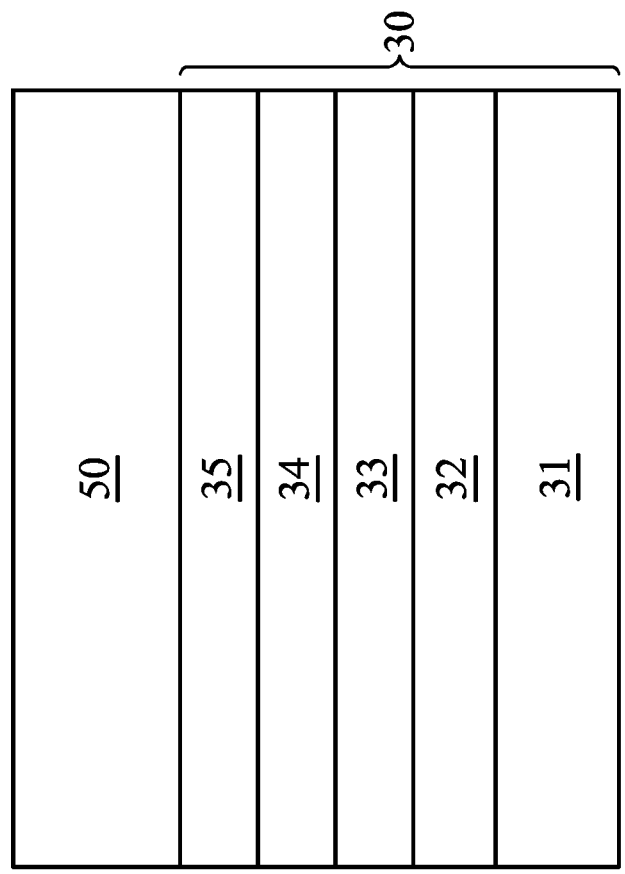
FIG. 3A is a schematic cross section view of a solar cell device described herein.
Figure 3B:
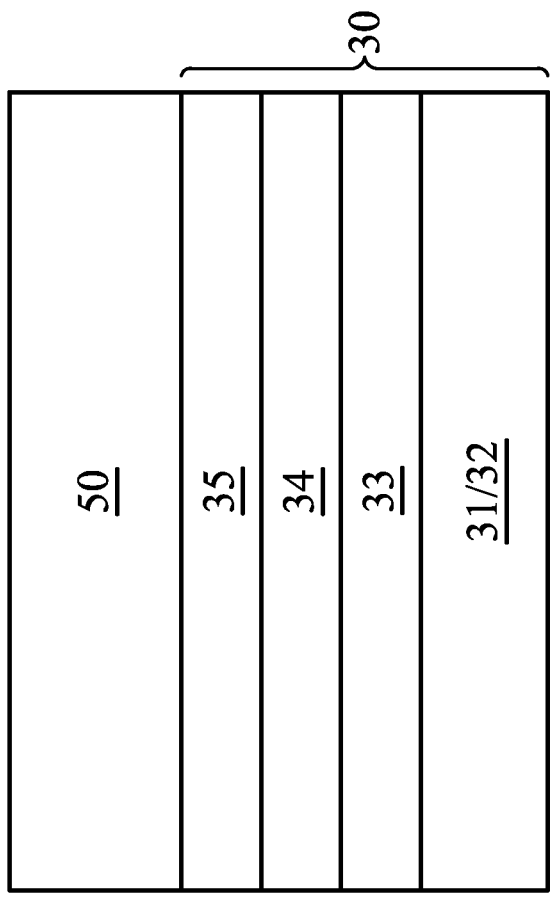
FIG. 3B is a schematic cross section view of a solar cell device described herein.

FIGS. 3A and 3B show cross-sections of photovoltaic substructures 30 in accordance with some embodiments. As shown in FIG. 3A, the back contact 32 can be deposited over the substrate 31 (e.g., by sputtering). In some embodiments, the substrate 31 can include any suitable material, including glass (e.g., soda lime glass or sodium-free (high strain point) glass) or a flexible metal foil or polymer (e.g., polyimide, polyethylene terephthalate (PET), polyethylene naphthalene (PEN)). The back contact 32 can include any suitable conductive material, such as metals and metal precursors. In some embodiments, the back contact 32 can include molybdenum (Mo), platinum (Pt), gold (Au), silver (Ag), nickel (Ni), or copper (Cu). For example, in some embodiments, a back contact layer of Mo is provided, above which a $Cu(In,Ga)Se_2$ (CIGS) absorber layer can be formed. In another example, in some embodiments, a back contact layer of Cu or Ni is provided, above which a cadmium telluride (CdTe) absorber layer can be formed. The thickness of the back contact layer 32 is on the order of nanometers or micrometers, for example, in the range of from about 100 nm to about 20 microns in some embodiments. In some embodiments as shown in FIG. 3B, a thin film solar cell substructure 30 is formed with a metal-foil substrate 31/32, serving as both the substrate 31 and the back contact 32. In such embodiments, a separate back contact 32 layer can be omitted, e.g. providing a metal-foil substrate at substep 110 can replace substep 120 as the substrate 31/32 also serves as a back contact 32.

The absorber 33 can be deposited over the back contact 32. In some embodiments, the absorber materials can include p-type semiconductors, such as CIGS, CdTe, $CuInSe_2$ (CIS), $CuGaSe_2$ (CGS), $Cu(In,Ga)(Se,S)_2$ (CIGSS), or amorphous silicon. The buffer 34 can be deposited over the absorber 33. In some embodiments, the buffer can include n-type semiconductors, such as cadmium sulphide, zinc sulphide, zinc selenide, indium (III) sulfide, indium selenide, or $Zn_{1-x}Mg_xO$, (e.g., ZnO). In some embodiments, the absorber layer 33 is formed by a different technique that provides suitable uniformity of composition (e.g., chemical vapor deposition (CVD), atomic layer deposition (ALD), etc.).

The buffer layer 34 is formed above the absorber layer 33. In some embodiments, the buffer layer 34 can be one of the group consisting of CdS, ZnS, ZnSe, $In_2S_3$, $In_2Se_3$, and $Zn_{1-x}Mg_xO$, (e.g., ZnO). Other suitable buffer layer materials can be used. The thickness of the buffer layer 34 is on the order of nanometers, for example, in the range of from about 5 nm to about 100 nm in some embodiments.

Formation of the buffer layer 34 is achieved through a suitable process such as sputtering or chemical vapor deposition. For example, in some embodiments, the buffer layer 34 is a layer of CdS, ZnS or a mixture of CdS and ZnO, deposited through a hydrothermal reaction or chemical bath deposition (CBD) in a solution. For example, in some embodiments, a buffer layer 34 comprising a thin film of ZnS is formed above absorber layer 33 comprising CIGS. The buffer layer 34 is formed in an aqueous solution comprising $ZnSO_4$, ammonia and thiourea at 80 Celsius. A suitable solution comprises 0.16M of $ZnSO_4$, 7.5M of ammonia, and 0.6M of thiourea in some embodiments.

The front contact 35 can be deposited over the buffer 34. In some embodiments, the front contact 35 can include suitable front contact materials, such as metal oxides (e.g. indium oxide) and doped metal oxides (e.g. boron-doped zinc oxide).

Examples of suitable material for the front contact 35 include but are not limited to transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron doped ZnO (BZO), and any combinations thereof. A suitable material for the front contact layer 35 can also be a composite material comprising at least one of the transparent conductive oxide (TCO) and another conductive material, which does not significantly decrease electrical conductivity or optical transparency of the front contact 35. The thickness of the front contact 35 is in the order of nanometers or microns, for example in the range of from about 0.3 nm to about 2.5 μm in some embodiments In some embodiments, the transparent cover 50 is formed separately from the photovoltaic substructure 30. The transparent cover 50 includes a transparent layer 55 and a plasmonic nanostructured layer 57. As used herein, the phrase "transparent layer" refers to a layer of transparent material forming the transparent cover 50. The transparent layer 55 can include any suitable transparent material, such as glass or a polymer. The plasmonic nanostructured layer 57 induces plasmonic effects in the transparent cover 50. In particular, the coherent collective oscillation of conduction electrons surrounding the plasmonic nanostructured layer 57 result in LSPR. When the frequency of incident light matches the excitation frequency of LSPR, the transparent cover 50 provides a strong forward scattering of light, improving the transmittance of incident light. In particular, the plasmonic nanostructured layer 57 increases the light traveling length through the transparent cover 50.

The enhanced optical properties of the transparent cover 50 can be adjusted based on the material, size, shape and local dielectric environment of the plasmonic nanostructured layer 57. In some embodiments, the plasmonic nanostructured layer 57 can include metals, such as Au, Ag, Pt, aluminum (Al), Cu, or combinations of metals. In some embodiments, the plasmonic nanostructured layer 57 can include plasmonic metal oxides, such as aluminum oxide. The nanoparticles can also have various shapes, including substantially in the shape of a sphere, rod, or triangle, or the nanoparticles can be substantially amorphous. The nanoparticles for the plasmonic nanostructured layer 57 can be in a form such as nanotube, nanoplatelet, nanorod, nanoparticle, nanosheet or any other shapes or combinations thereof.

In some embodiments, the plasmonic nanostructured layer includes a plurality of nanoparticles. In some embodiments, the nanoparticle size can be about 5 nm or more, 10 nm or more, 15 nm or more, 20 nm or more, 25 nm or more, 30 nm or more, 35 nm or more, 40 nm or more, 45 nm or more, 50 nm or more, 60 nm or more, 100 nm or more, 150 nm or more, and 200 nm or more. In other embodiments, the nanoparticle size can be about 300 nm or less, 250 nm or less, 200 nm or less, 100 nm or less, 75 nm or less, 70 nm or less, 60 nm or less, 50 nm or less, 45 nm or less, or 30 nm or less. In other embodiments, the nanoparticle size can range between a combination of the foregoing. For example, ranging from about 5 nm to 300 nm, 30 nm to 300 nm, 30 nm to 100 nm, 30 nm to 50 nm, 20 nm to 70 nm, 30 nm to 70 nm, 60 nm to 80 nm, 100 nm to 150 nm, and 50 nm to 200 nm. As used herein, the term "about" with respect to nanoparticle size includes minor deviations from the nominal value. For example, deviations of plus or minus 1 nm, or plus or minus 2 nm, or plus or minus 5 nm.

The plasmonic nanostructured layer 57 is in contact with the transparent layer 55. As used herein, the phrase "in contact" with respect to the transparent layer 55 refers to positioning on, within or otherwise abutting the transparent layer 55, including on or within any coatings or other treatments applied to the transparent layer 55. FIGS. 4-6 show various positions of the plasmonic nanostructured layer 57 for some embodiments. In some embodiments shown in FIG. 4, the plasmonic nanostructured layer 57 is on top of the transparent layer 55. In other embodiments shown in FIG. 5, the plasmonic nanostructured layer 57 is positioned below the transparent layer 55. In other embodiments shown in FIG. 6, the plasmonic nanostructured layer 57 is positioned within the transparent layer 55.

In some embodiments, the plasmonic nanostructured layer 57 includes a plurality of plasmonic nanostructured layers (57a, 57b, etc.). The plurality of layers 57 can be continuous or can be spaced apart from each other in any combination of positions. For example, the transparent layer 55 can be sandwiched between two plasmonic nanostructured layers 57a, 57b as shown in FIG. 7. In another example, one plasmonic nanostructured layer 57a can be on top of the transparent layer 55 and another plasmonic nanostructured layer 57c can be within the transparent layer 55 as shown in FIG. 8. Other embodiments include three or more separated plasmonic nanostructured layers 57.

Figure 9:
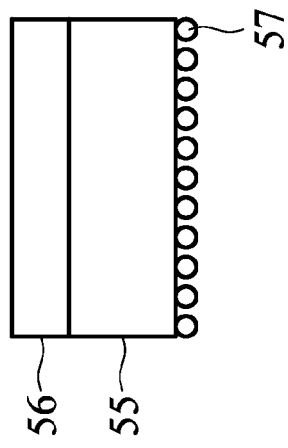
FIG. 9 is a schematic cross section view of a transparent cover described herein.
Figure 10:
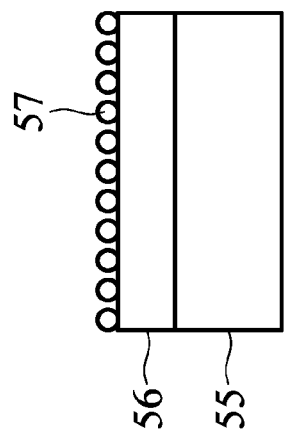
FIG. 10 is a schematic cross section view of a transparent cover described herein.
Figure 11:
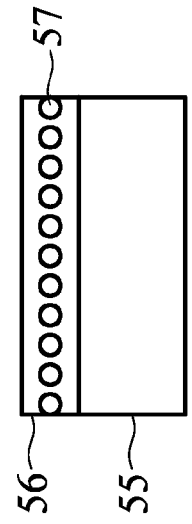
FIG. 11 is a schematic cross section view of a transparent cover described herein.
Figure 12:
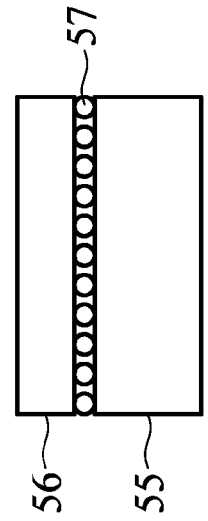
FIG. 12 is a schematic cross section view of a transparent cover described herein.

In some embodiments, the transparent cover 50 also includes an anti-reflective coating 56. The anti-reflective coating 56 can include materials to reduce reflection of incident light, such silicon monoxide (SiO). The anti-reflective coating 56 further enhances the benefits of the plasmonic nanostructured layer 57. While anti-reflective coatings reduce optical loss by reducing the amount of reflected light, the plasmonic nanostructured layer 57 provides efficient forward scattering of light through and/or below the transparent cover 50. The plasmonic nanostructured layer 57 can also be incorporated with the anti-reflective coating 56 on the transparent layer 55. For example in some embodiments, the plasmonic nanostructured layer 57 can be on top of the anti-reflective coating 56 as shown in FIG. 9. In other embodiments, the plasmonic nanostructured layer 57 can be below the anti-reflective coating 56, including below the anti-reflective coating 56 and transparent layer 55 as shown in FIG. 10 and between the anti-reflective coating 56 and transparent layer 55 as shown in FIG. 11. In other embodiments, the plasmonic nanostructured layer 57 can be within the anti-reflective coating 56 as shown in FIG. 12.

Figures 2B, 2C:
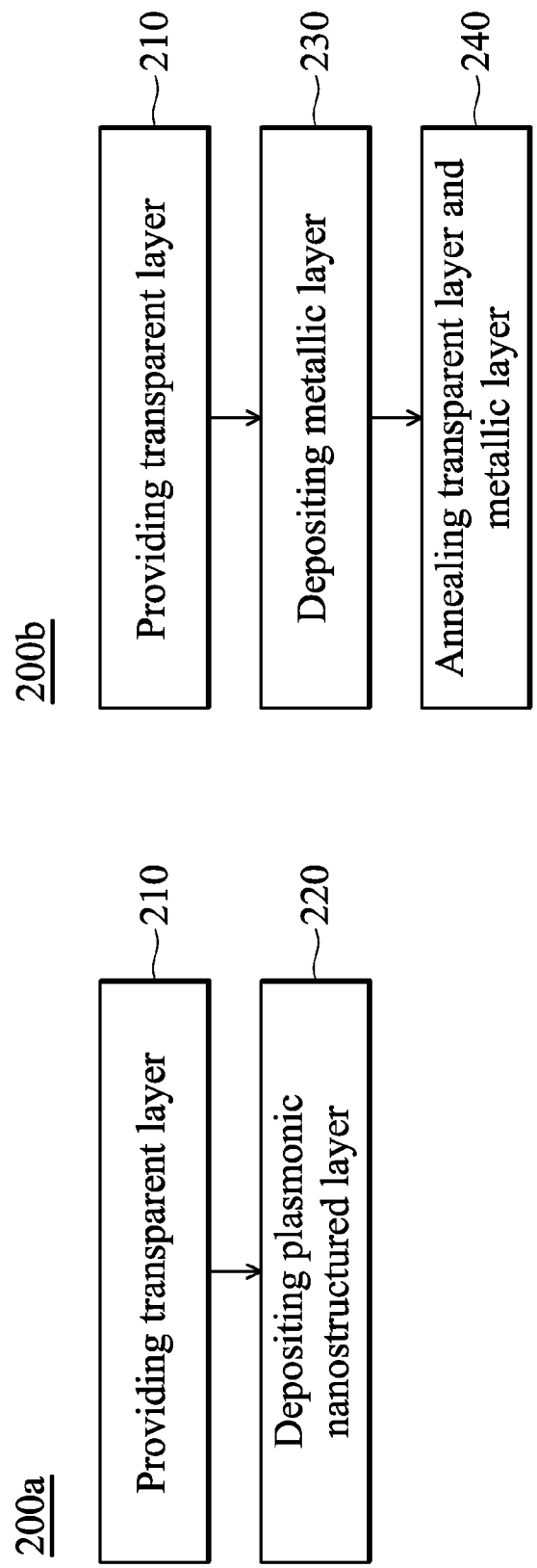
FIG. 2B is a flow chart of a method for step 200 of FIG. 1 described herein.
FIG. 2C is a flow chart of a method for step 200 of FIG. 1 described herein.

In some embodiments, the transparent cover 50 is formed by incorporating at least one plasmonic nanostructured layer 57 with a transparent layer 55. As shown in FIG. 2B at substep 210, a transparent layer can be provided. At substep 220, a plasmonic nanostructured layer is deposited in contact with the transparent layer. In some embodiments, the plasmonic nanostructured layer can be deposited by physical deposition methods, such as sputtering, thermal evaporation, or wet processing techniques (e.g., screen printing), or other deposition techniques like chemical vapor deposition (CVD), atomic layer deposition (ALD).

In various embodiments, the transparent cover 50 including plasmonic nanostructured layer 57 can be formed by annealing a metallic layer, such as Au, Ag, Al or Cu nanoparticles or the like, in a thickness of about 1 nm more, 5 nm or more, 15 nm or more, and 30 nm more. In other embodiments, the thickness of the metallic layer is about 50 nm or less, about 30 nm or less, about 25 nm or less, and about 20 nm or less. In other embodiments, the thickness ranges between a combination of any two of the foregoing range boundary values. For example, ranging from about 1 nm to about 30 nm. As shown in FIG. 2C at substep 210, a transparent layer can be provided. At substep 230, a metallic layer is deposited in contact with the transparent layer. In some embodiments, the metallic layer can be deposited by sputtering, thermal evaporation, chemical vapor deposition (CVD), atomic layer deposition (ALD), etc. At substep 240, the transparent cover, including the metallic layer and transparent layer, is annealed. In some embodiments, the annealing temperature for the transparent cover can be about 200° C. or more, 250° C. or more, 300° C. or more, 350° C. or more, 400° C. or more, and 450° C. or more. In other embodiments, the annealing temperature for the transparent cover can be about 500° C. or less, 450° C. or less, 400° C. or less, 300° C. or less, and 250° C. or less. In other embodiments, the annealing temperature can range between a combination of the foregoing. For example, ranging from about 200° C. to 500° C., 200° C. to 250° C., 250° C. to 300° C., 250° C. to 500° C., and 300° C. to 450° C. As used herein, the term "about" with respect to temperature includes minor deviations from the nominal value. For example, deviations of plus or minus 1 degree, or plus or minus 5 degrees, or plus or minus 10 degrees.

In some embodiments, the annealing temperature is selected based on the plasmonic nanostructured layer material. For example, the annealing temperature for Cu can be about 400° C.; the annealing temperature for Ag can be about 250° C.; the annealing temperature for Au can be about 300° C.; and the annealing temperature for Al can be about 200° C. to 250° C.

In some embodiments, the annealing time for the transparent cover is about 15 minutes (min) or more, 20 min or more, 25 min or more, 30 min or more, and 45 min or more. In other embodiments, the annealing time for the transparent cover is about 1 hour or less, 50 min or less, 45 min or less, 30 min or less, and 20 min or less. In other embodiments, the annealing time ranges between a combination of the foregoing range boundary values. As used herein, the term "about" with respect to time includes minor deviations from the nominal value. For example, deviations of plus or minus 1 minute, or plus or minus 5 minutes. In some embodiments, annealing the transparent cover can be performed under ambient conditions. In some embodiments, the annealing process can be performed under gas atmospheres, such as argon, nitrogen, and the like.

In some embodiments, the transparent cover undergoes additional processing operations provide additional features or properties. For example, further processing can include applying an anti-reflective coating to the transparent layer. The application of the anti-reflective coating can be performed before, after or contemporaneous with the deposition of the plasmonic nanostructured layer.

In some embodiments, the substeps of forming the transparent cover 200 are performed in-line. For example, step 200 can be performed within a single chamber providing functions for providing the transparent layer 210, depositing the plasmonic nanostructured layer 220 in-line. In various embodiments, the substeps of forming the transparent cover 200 can be performed with a single chamber providing the transparent layer 210, depositing a metallic layer 230 and annealing the transparent layer and metallic layer 240 in-line.

In some embodiments, the formation of the transparent cover 50 is separate from the photovoltaic substructure 30 fabrication. Thermal damage to the absorber 33, buffer 34 and/or front contact 35 of the photovoltaic substructure 30 occurs at temperatures of about 80° C. or greater. The separate formation provides the solar cell device with the optical advantages of the transparent cover 50 without a loss in electrical properties of the photovoltaic substructure 30. For example, the transparent cover 50 can be annealed at temperatures of about 200° C., greater than 200° C., 250° C. or greater, 300° C. or greater, and 400° C. and greater without damaging the photovoltaic substructure 30.

As shown in FIG. 1 at step 300, the transparent cover is adhered on top of the photovoltaic substructure. As used herein, the terms "adhere," "adhered," and "adhering" refer to attaching structure, including fixed or removable attachment. The transparent cover can protect the photovoltaic substructure below, as well as enhance the optical transmission of light to the active layers of the photovoltaic substructure.

Figure 2D:
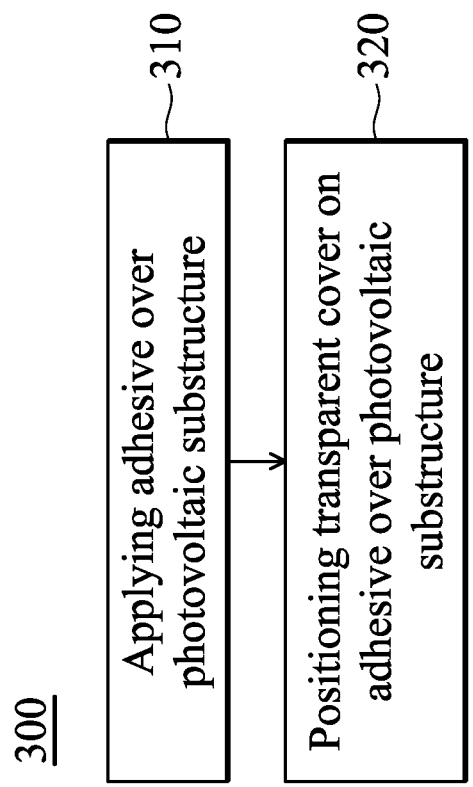
FIG. 2D is a flow chart of a method for step 300 of FIG. 1 described herein.

As shown in FIG. 2D at substep 310, an adhesive is applied over the photovoltaic substructure. In some embodiments, the adhesive is an adhesive film, including a transparent adhesive film. The adhesive film can include suitable transparent and adhesive materials, such as resins and polymers. For example, the adhesive film can include an ethylene-vinyl acetate (EVA), an ethylene-methyl acrylate copolymer, an ethylene-ethyl acrylate copolymer, a polyamide resin, a butyral resin, or a urethane resin. At substep 320, the transparent cover is positioned over the photovoltaic substructure and on the adhesive.

Figure 13:
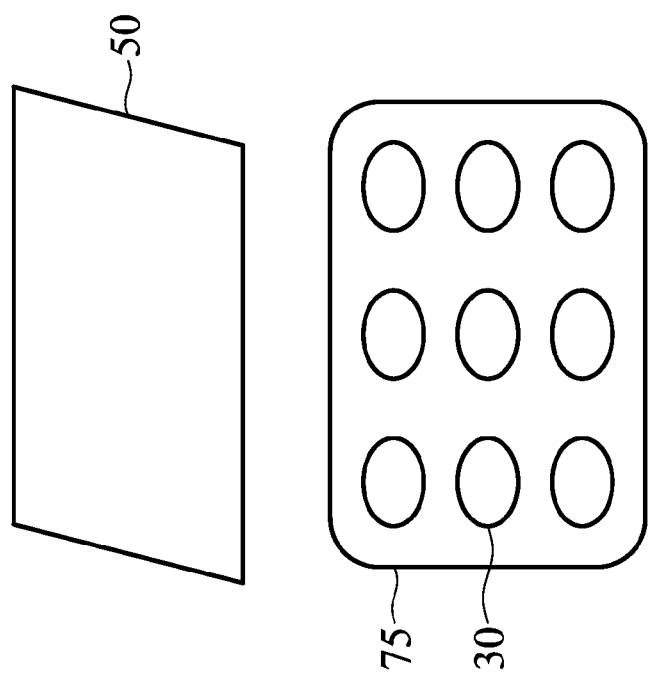
FIG. 13 is an exploded view of a solar module described herein.
Figure 14:
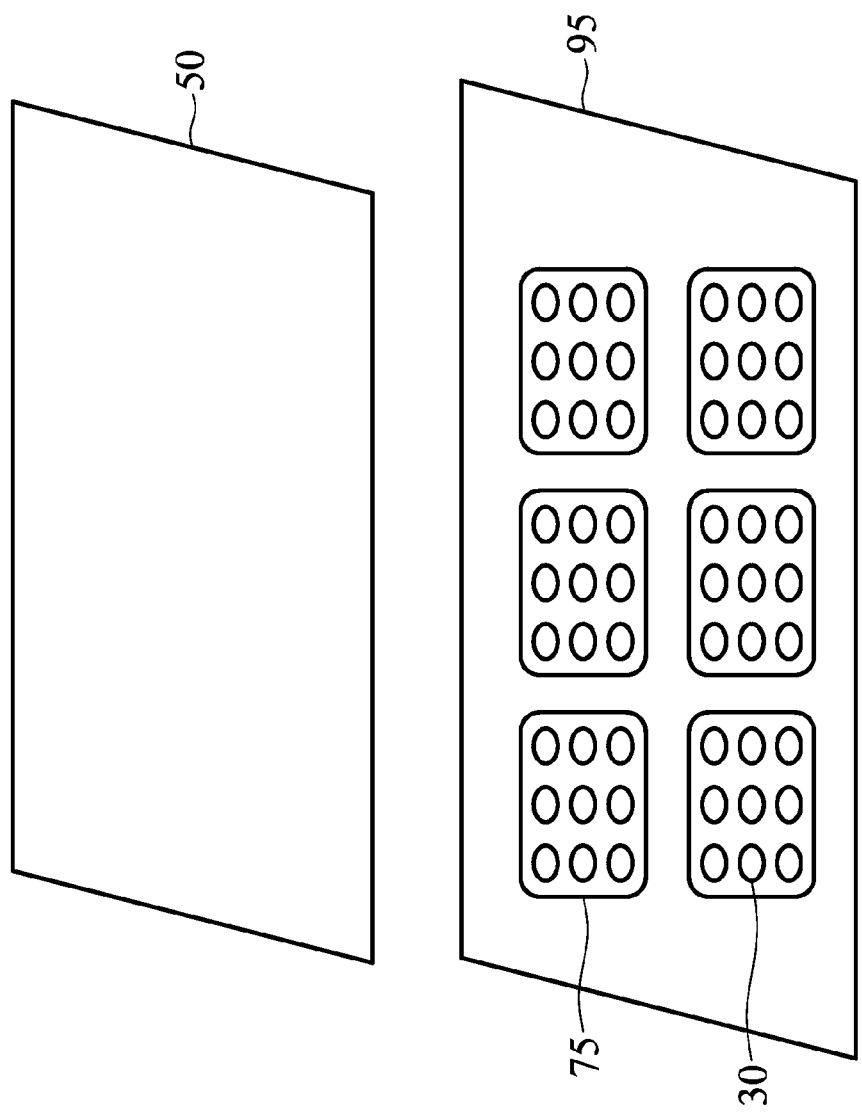
FIG. 14 is an exploded view of a solar panel described herein.

In some embodiments as shown in FIG. 13, a plurality of photovoltaic substructures or solar cells 30 are connected to form a solar module 75 and the transparent cover 50 is adhered on top of the module 75. In some embodiments as shown in FIG. 14, a plurality of solar module 75 is connected to form a solar panel 95 and the transparent cover 50 is adhered on top of the panel 95.

EXAMPLE

A conventional protective cover (C00) consisting of glass was provided. For comparison, a transparent cover (C01) was fabricated according to the methods described herein. A thin film of Cu nanoparticles was deposited onto a front glass between an anti-reflection coating and the front glass. The thin film had a thickness of about 5-10 nm. The cover was annealed at 350° C. for a period of 30 min. The transmittance of light through each of the covers C00 and C01 was measured.

Figure 15:
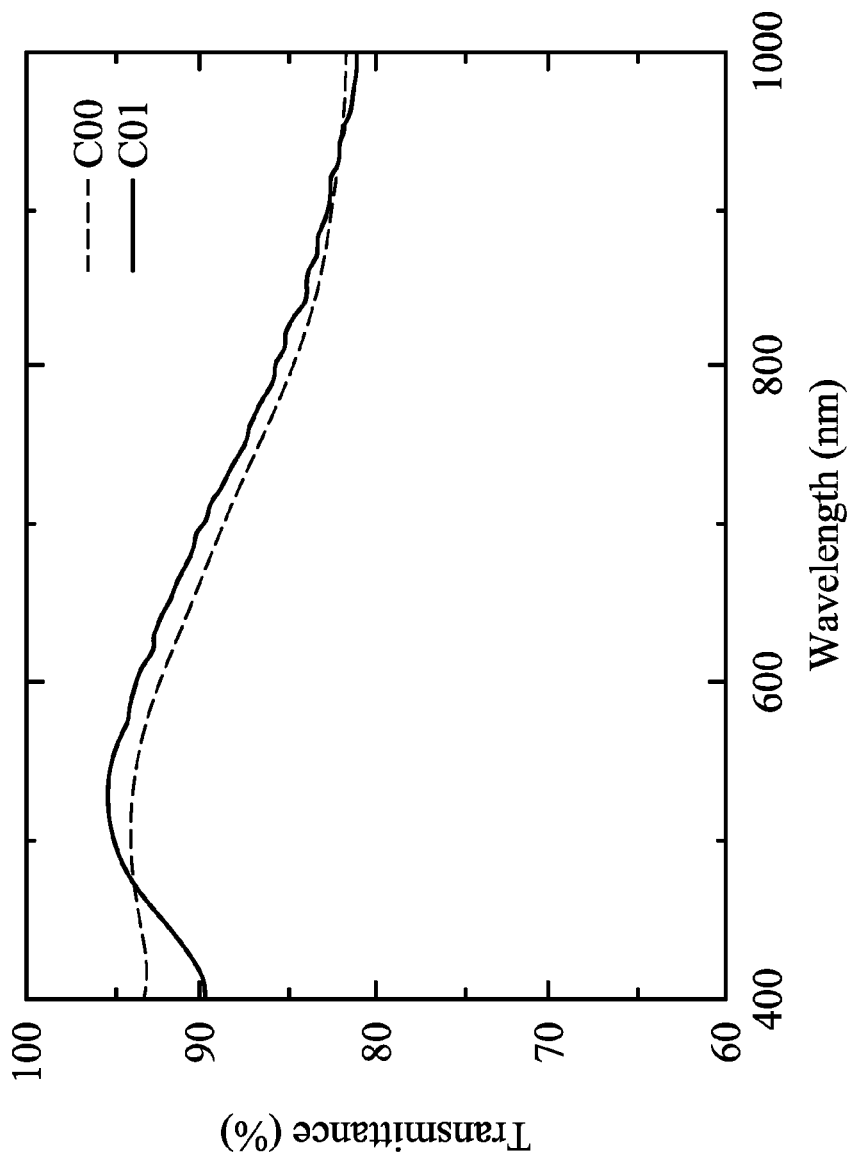
FIG. 15 is a chart showing transmittance data for a conventional cover and a transparent cover described herein.

FIG. 15 shows data for the transmittance of light at various wavelengths through C00 and C01. For wavelengths from about 450 nm to 950 nm, the C01 transparent cover had a higher transmittance than the C00 glass. The highest transmittance observed for the C01 transparent cover was about 95%, while the highest transmittance observed for the C00 glass was about 92%.

In summary, the disclosed methods and transparent cover provide solar cell devices with improved efficiency due to the enhanced light-harvesting transparent covers. The increase in transmittance through the transparent cover increases the amount of light that can be absorbed by the solar cell and the exploitation of LSPR effects in the transparent cover increases the traveling length of light that passes through the absorber, significantly improving light harvesting by each solar cell. Additionally, the methods and device maximize efficiency by gaining the benefits of enhanced optical properties in the transparent cover without degrading the electrical properties of the photovoltaic substructures.

The transparent cover disclosed herein has enhanced optical properties, exploiting localized surface plasmon resonance (LSPR) to induce forward light scattering and increase the travelling length of incident light through the transparent cover. The enhanced optical properties increases the amount of light passing through the transparent cover to the absorber layers of the solar cell and improves the efficiency of the device. Moreover, the transparent cover disclosed herein is incorporated with the solar cell or solar module without degrading the photovoltaic substructures.

Although particular examples are described above, the structures and methods described herein can be applied to a variety of solar cells, such as CIGS and other chalcopyrite-based solar cells such as CIS, CGS, CIGSS, and a-Si thin film, CdTe with pn junction, p-i-n structure, MIS structure, and multi-junction.

In some embodiments, a method for fabricating a solar cell includes providing a substrate; depositing a back contact, absorber and buffer over the substrate to form a photovoltaic substructure; forming a transparent cover separate from the photovoltaic substructure including a transparent layer and a plasmonic nanostructured layer in contact with the transparent layer; and adhering the transparent cover on top of the photovoltaic substructure.

In some embodiments, the transparent cover further includes an anti-reflective coating.

In some embodiments, the photovoltaic substructure further includes a transparent conductive oxide layer between the buffer and the transparent cover.

In some embodiments, the adhering step includes depositing an adhesive film over the photovoltaic substructure and positioning the transparent cover on the adhesive film.

In some embodiments, the adhesive film includes a polymer or resin.

In some embodiments, the forming step includes depositing a plasmonic nanostructured layer in contact with the transparent layer In some embodiments, the forming step includes depositing a metallic layer in contact with the transparent layer and annealing the metallic layer and transparent layer.

In some embodiments, the metallic layer, such as Au, Ag, Al or Cu, or the like, and transparent layer are annealed at a temperature ranging from about 200° C. to about 500° C. to form a transparent cover having a nanostructured plasmonic layer.

In some embodiments, the providing, depositing, forming and adhering steps are performed in-line.

In some embodiments, a transparent cover for a solar cell includes a transparent layer over a photovoltaic substructure and a plasmonic nanostructured layer in contact with the transparent layer.

In some embodiments, the plasmonic nanostructured layer includes metals or metal oxides.

In some embodiments, the plasmonic nanostructured layer includes metal nanoparticles.

In some embodiments, the plasmonic nanostructured layer includes metals selected from Au, Ag, Pt, Al, Cu, or combinations thereof.

In some embodiments, the plasmonic nanostructured layer includes nanoparticles with a size ranging from about 5 nm to about 300 nm.

In some embodiments, the plasmonic nanostructured layer is on top of the transparent layer.

In some embodiments, the plasmonic nanostructured layer is below the transparent layer.

In some embodiments, the plasmonic nanostructured layer is within the transparent layer.

In some embodiments, the plasmonic nanostructured layer includes a plurality of plasmonic nanostructured layers.

In some embodiments, a solar module includes a plurality of solar cells and a transparent cover attached on top of the plurality of solar cells with a transparent adhesive film, wherein the transparent cover includes a transparent layer and a plasmonic nanostructured layer in contact with the transparent layer.

In some embodiments, the transparent cover includes glass and the plasmonic nanostructured layer includes metal nanoparticles.

In some embodiments, the transparent cover further includes an anti-reflective coating.

The descriptions of the fabrication techniques for exemplary embodiments may be performed using any suitable commercially available equipment commonly used in the art to manufacture solar cell devices, or alternatively, using future developed equipment and techniques.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for fabricating a solar cell, comprising:
   depositing a back contact, an absorber, a buffer, and a front contact over a substrate to form a photovoltaic substructure;
   forming a transparent cover separate from said photovoltaic substructure by:
   depositing a metallic layer by physical deposition, chemical vapor deposition (CVD) or atomic layer deposition (ALD) on a bottom surface of a transparent layer,
   depositing an anti-reflective coating on a top surface of the transparent layer, and
   annealing said metallic layer, anti-reflective coating, and transparent layer to form said transparent cover with a plasmonic nanostructured layer on said bottom surface of said transparent cover; and
   adhering said transparent cover on top of said photovoltaic substructure, wherein said plasmonic nanostructured layer on said bottom surface of said transparent cover is in direct contact with said front contact of said photovoltaic structure, so as to be sandwiched between said bottom surface of said transparent cover and said front contact of said photovoltaic structure.

2. The method as in claim 1, wherein said metallic layer and transparent layer are annealed at a temperature ranging from about 200° to about 500° C.

3. The method as in claim 1, wherein said depositing, forming and adhering steps are performed in-line.

4. The method as in claim 1, wherein said plasmonic nanostructured layer comprises metal nanoparticles.

5. The method as in claim 1, wherein said metallic layer comprises metals selected from Au, Ag, Pt, Al, Cu, or combinations thereof.

6. The method as in claim 1, wherein said plasmonic nanostructured layer comprises metal nanoparticles with a size ranging from about 5 nm to about 300 nm.

7. The method as in claim 1, wherein said plasmonic nanostructured layer comprises nanoparticles with a size ranging from about 30 nm to about 300 nm.

8. The method as in claim 1, wherein said metallic layer has a thickness ranging from about 1 nm to about 30 nm.

9. The method as in claim 1, wherein depositing said metallic layer is performed by sputtering.

10. A method for fabricating a solar cell, comprising:
    depositing a back contact, a chalcopyrite absorber, a buffer, and a front contact over a substrate to form a photovoltaic substructure;
    forming a transparent cover separate from said photovoltaic substructure comprising:
    providing a transparent layer,
    depositing an anti-reflective coating on a top surface of said transparent layer,
    depositing metal nanoparticles on a bottom surface of said transparent layer by physical deposition, chemical vapor deposition (CVD) or atomic layer deposition (ALD); and
    annealing said metal nanoparticles and transparent layer to form a plasmonic nanostructured layer; and then
    adhering said transparent cover on top of said photovoltaic substructure, wherein said plasmonic nanostructured layer on said bottom surface of said transparent cover is in direct contact with said front contact of said photovoltaic structure, so as to be sandwiched between said bottom surface of said transparent cover and said front contact of said photovoltaic structure.

11. The method as in claim 10, wherein said transparent cover has a transmittance of about 95% or greater.

12. The method as in claim 10, wherein said plasmonic nanostructructured layer comprises plasmonic metal oxides.

13. The method as in claim 10, wherein said plasmonic nanostructured layer comprises nanoparticles with various shapes.

14. A method for fabricating a solar module, comprising:
    connecting a plurality of photovoltaic substructures each comprising a back contact, absorber, a buffer, and a front contact over a substrate to form a module;

forming a transparent cover separate from said photovoltaic substructures by:
depositing a metallic layer by physical deposition, chemical vapor deposition (CVD) or atomic layer deposition (ALD) on a bottom surface of a transparent layer,
annealing said metallic layer and transparent layer to form a plasmonic nanostructured layer
depositing an anti-reflective coating on a top surface of said transparent layer; and
adhering said transparent cover on top of said module, so as to sandwich said plasmonic nanostructured layer between said bottom surface of said transparent cover and said front contact of said module; wherein said plasmonic nanostructured layer is in direct contact with said front contact of said module.

15. The method as in claim 14, wherein:
said metallic layer comprises metals nanoparticles selected from Au, Ag, Pt, Al, Cu, or combinations thereof on said transparent layer; and
said annealing step is performed at a temperature of about 200° C. or greater.

16. The method as in claim 14, wherein said annealing metallic layer is performed under inert gas atmosphere.

* * * * *